(12) United States Patent
Jami

(10) Patent No.: US 9,130,563 B1
(45) Date of Patent: Sep. 8, 2015

(54) PROGRAMMABLE RECEIVERS AND METHODS OF IMPLEMENTING A PROGRAMMABLE RECEIVER IN AN INTEGRATED CIRCUIT

(71) Applicant: Xilinx, Inc., San Jose, CA (US)

(72) Inventor: Gautham S. Jami, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/285,519

(22) Filed: May 22, 2014

(51) Int. Cl.
*H03K 19/094* (2006.01)
*H03K 19/0948* (2006.01)
*H03K 19/177* (2006.01)

(52) U.S. Cl.
CPC ...... *H03K 19/0948* (2013.01); *H03K 19/17736* (2013.01)

(58) Field of Classification Search
CPC .......... H03K 17/164; H03K 19/01742; H03K 19/017581; H04L 25/028
USPC ................................. 326/80–83, 87
See application file for complete search history.

(56) References Cited

U.S. PATENT DOCUMENTS

| | | | |
|---|---|---|---|
| 6,448,807 B1* | 9/2002 | Ahsanullah | 326/30 |
| 6,591,093 B1* | 7/2003 | Coffing et al. | 455/319 |
| 7,149,271 B2* | 12/2006 | Yamada et al. | 326/30 |
| 7,907,461 B1 | 3/2011 | Nguyen et al. | |
| 2010/0182090 A1* | 7/2010 | Yang et al. | 330/277 |
| 2013/0257513 A1* | 10/2013 | Sanchez | 327/404 |
| 2014/0062561 A1* | 3/2014 | Li | 327/206 |

* cited by examiner

*Primary Examiner* — Don Le
(74) *Attorney, Agent, or Firm* — John J. King

(57) ABSTRACT

A programmable receiver of an integrated circuit is described. The programmable receiver comprises an input; a first programmable receiver circuit coupled to the input, wherein the first programmable receiver circuit has a first pull-up branch and a first pull-down branch and is controlled by a first enable circuit; a second programmable receiver circuit coupled to the input, wherein the second programmable receiver circuit has a second pull-up branch and a second pull-down branch and is controlled by a second enable circuit; and an output stage coupled to the first programmable receiver circuit and the second programmable receiver circuit, wherein the output stage receives an output of one of the first programmable receiver circuit and the second programmable receiver circuit. A method of implementing a programmable receiver in an integrated circuit is also disclosed.

19 Claims, 6 Drawing Sheets

PROGRAMMABLE RECEIVERS AND METHODS OF IMPLEMENTING A PROGRAMMABLE RECEIVER IN AN INTEGRATED CIRCUIT

FIELD OF THE INVENTION

The present invention relates generally to integrated circuit devices, and in particular, to programmable receivers and methods of implementing programmable receivers in an integrated circuit.

BACKGROUND OF THE INVENTION

Data transmission is an important part of many integrated circuits and systems having integrated circuits. Data is typically communicated with an integrated circuit by way on an input/output (I/O) port. Data may be communicated in a system in different formats and according to a variety data communication protocols. However, the input/output circuits can significantly affect the performance of an integrated circuit device. Accordingly, I/O ports are often designed to enable certain performance characteristics of the I/O port, and therefore the integrated circuit device and possibly a system implementing the integrated circuit device.

One example of a receiver circuit for receiving data in an input/output port is a Schmitt trigger device which provides hysteresis to insure that the data is properly received. Schmitt trigger devices or other receiver circuits may be implemented differently depending upon the voltage of the signal which is received. With technology advancements and data rates increasing, using the same circuit for receiving data according to different I/O standards may leave a reduced margin to correctly receive the data. Such technology and data rates may result in reduced performance, including data errors resulting from data which is not correctly received.

SUMMARY OF THE INVENTION

A programmable receiver of an integrated circuit is described. The programmable receiver comprises an input; a first programmable receiver circuit coupled to the input, wherein the first programmable receiver circuit has a first pull-up branch and a first pull-down branch and is controlled by a first enable circuit; a second programmable receiver circuit coupled to the input, wherein the second programmable receiver circuit has a second pull-up branch and a second pull-down branch and is controlled by a second enable circuit; and an output stage coupled to the first programmable receiver circuit and the second programmable receiver circuit, wherein the output stage receives an output of one of the first programmable receiver circuit and the second programmable receiver circuit.

Another implementation of a programmable receiver of an integrated circuit comprises an input; a first programmable receiver circuit coupled to the input, the first programmable receiver circuit having a first pull-up branch and a first pull-down branch; a first hysteresis circuit coupled to the first-pull up branch; a second programmable receiver circuit coupled to the input, the second programmable receiver circuit having a second pull-up branch and a second pull-down branch; a second hysteresis circuit coupled to the second pull-down branch; and an output stage coupled to the first programmable receiver circuit and the second programmable receiver circuit, wherein the output stage receives an output of one of the first programmable receiver circuit and the second programmable receiver circuit.

A method of implementing a programmable receiver in an integrated circuit is described. The method comprises coupling a first programmable receiver circuit to an input; coupling a second programmable receiver circuit to the input; enabling one of the first or second programmable receiver circuits; and generating, at an output stage, an output signal based upon the input signal.

Other features will be recognized from consideration of the Detailed Description and Claims, which follow.

DETAILED DESCRIPTION OF THE DRAWINGS

Figure 1:
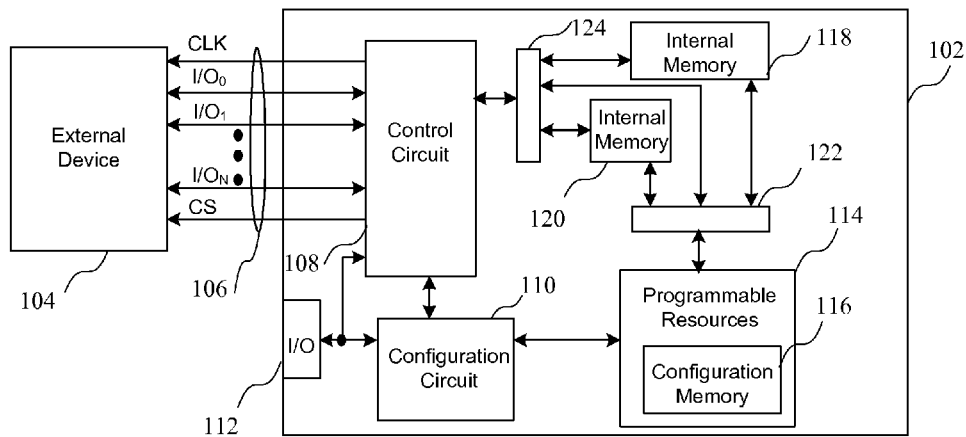
FIG. 1 is a block diagram of an integrated circuit having input/output ports.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

A programmable receiver of an integrated circuit is described. The programmable receiver comprises an input, a first programmable receiver circuit coupled to the input and having a first pull-up branch and a first pull-down branch, and second programmable receiver circuit coupled to the input and having a second pull-up branch and a second pull-down branch. An output stage coupled to the first programmable receiver circuit and the second programmable receiver circuit receives an output of one of the first programmable receiver circuit and the second programmable receiver circuit. The first programmable receiver circuit may be controlled by a first enable circuit and the second programmable receiver circuit may be controlled by a second enable circuit to enable coupling the output stage to one of the first programmable receiver circuit and the second programmable receiver circuit. Hysteresis circuits are advantageously placed to improve the performance of a receiver. A first hysteresis circuit may be coupled to the pull-up branch of the first programmable receiver circuit and a second hysteresis circuit may be coupled to a pull-down branch of the second programmable receiver circuit, where the second programmable receiver circuit is selected to receive a signal having a voltage which is greater than a voltage of a signal to be received by the first programmable receiver circuit.

The circuits set forth below may operate as a programmable CMOS Schmitt trigger, for example, and can be used as a receiver for different LVCMOS I/O standards such as the LVCMOS12, LVCMOS15 and LVCMOS18 standards. Programmability features of the circuits use different pull-up and pull-down circuit legs, where the appropriate choices of circuit legs will result in improved design margins for each of the LVCMOS I/O standards. Control signals that enable/disable different circuit legs are set when the receiver is programmed to a specific LVCMOS standard to reduce voltage headroom dependency and ensure good margins to design specifications.

Turning first to FIG. 1, a block diagram of an integrated circuit having input/output ports is shown. In particular, an integrated circuit device 102 is coupled to an external device 104 by way of communication links 106. The integrated circuit device could be any type of integrated circuit device, such as an application specific integrated circuit (ASIC) or an integrated circuit device having programmable resources, as will be described in more detail below. The integrated circuit device 102 comprises a control circuit 108 coupled to a configuration circuit 110. The configuration circuit 110 may receive configuration data from the external device 104 by way of the control circuit 108, or by way of an input/output (I/O) port 112. The configuration circuit 110 is used to configure the programmable resources 114 of the integrated circuit device by providing configuration data to the configuration memory 116. Alternatively, the configuration data could be provided to the configuration memory directly by the control circuit 108. The control circuit 108 and the programmable resources 114 may also be coupled to internal memory 118 and 120. Further, the integrated circuit device may optionally include dedicated interconnect elements 122, separate from interconnect elements associated with the programmable resources 114, for enabling access to the memory elements. The programmable resources and methods of receiving data may be implemented at various locations for receiving data from an external device, such as the control circuit 108 and the I/O port 112, or at any other receiver which may receive a signal internally.

Figure 2:
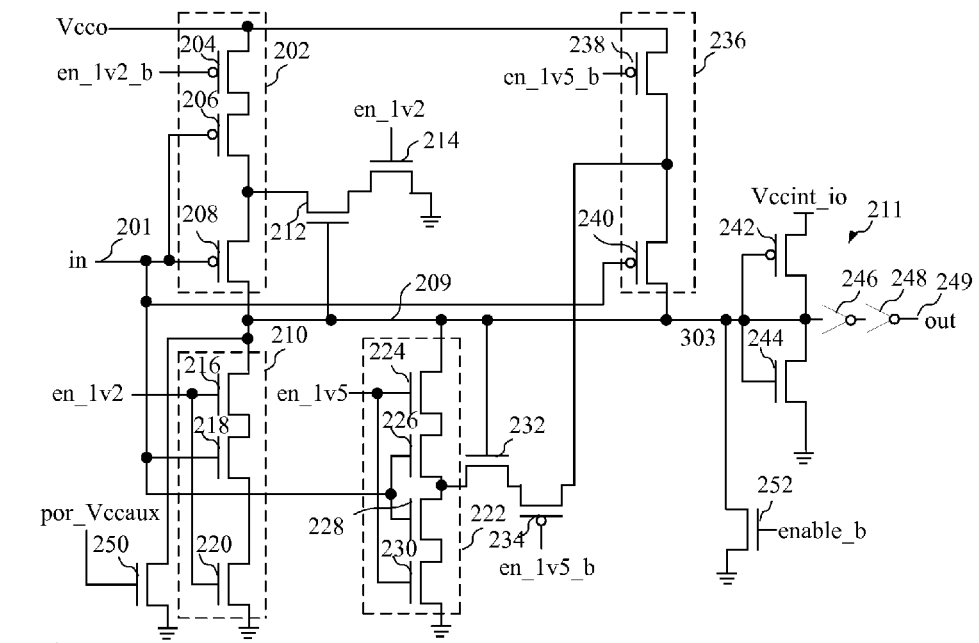
FIG. 2 is a block diagram of a programmable receiver adapted to receive data having one of two input voltages at an input/output port.

Turning now to FIG. 2, a block diagram of a programmable receiver 200 adapted to receive data having one of two input voltages at input/output ports is shown. The programmable receiver 200 comprises an input 201 coupled to receiver an input signal (in) at a first programmable receiver circuit comprising a pull-up branch 202 having p-channel transistors. The pull-up branch 202 comprises an enable transistor 204 coupled to receive a first inverted enable signal (en_1 v2_b) at a gate of the transistor 204. The enable transistor 204 is coupled in series with a pair of transistors 206 and 208 which are coupled to receive the input signal at a gate, where the source of the transistor 206 is coupled to the drain of the enable transistor 204 and the drain of the transistor 206 is coupled to a source of the transistor 208. The drain of the transistor 208 is coupled to an output node 209 at the pull-down branch 210 and at an output stage of the programmable receiver. The node at the drain of transistor 206 and the source of the transistor 208 is coupled to a hysteresis circuit comprising a first transistor 212 having a gate coupled to the drain of the transistor 208 and a second transistor 214 coupled to receive the first enable signal (en_1v2). A hysteresis circuit alters a trip point voltage Vil required for a rising signal to transition from low to high at an output or a trip point voltage Vih required for a falling signal to transition from high to low at an output, and therefore prevents unnecessary switching. By providing hysteresis on the pull-up branch for a low voltage receiver circuit, such as a 1.2 volt circuit, more margin is provided on the voltage Vil (i.e. reduce Vil so that an output will transition from low to high for a lower input signal) to improve performance of the low voltage receiver circuit. Similarly, by providing hysteresis on the pull-down branch for a higher voltage circuit, greater margin (i.e. increase Vih so that an output will transition from high to low for a higher input signal) to improve the performance of a higher voltage receiver circuit. The input signal is also coupled to the pull-down branch 210 having n-channel transistors comprising an enable transistors 216 coupled to receive the first enable signal at its gate. The enable transistor 216 is coupled in series with a transistor 218 coupled to receive the input signal at its gate and a transistor 220 which is also coupled to receive the first enable signal at its gate. The drain of the transistor 216 is coupled to the output node 209 of the programmable receiver.

A second programmable receiver circuit is coupled to receive the input signal and generate an output signal coupled to the output node 209 of the programmable receiver. While the second programmable receiver circuit is coupled to receive a separate enable signal to enable the selection of the second programmable receiver circuit to generate an output signal, a hysteresis circuit associated with second programmable receiver circuit is coupled to a pull down branch of the programmable receiver rather than a pull-up branch as with the first programmable receiver circuit. As will be described in more detail below, the hysteresis circuits are selectively placed with either the pull-up branch or the pull-down branch to provide improved performance of the programmable receiver based upon input voltages of input signals which may be received. More particularly, a pull-down branch 222 of the second programmable receiver comprises transistors 224-230 coupled in series between the output node 209 and a ground (GND) potential. The enable transistors 224 and 230 are coupled to receive a second enable signal (en_1v5) at their gates. The enable transistors 224 and 230 are coupled in series with a pair of transistors 226 and 230, each of which is coupled to receive the input signal at its gate.

A hysteresis circuit associated with the second programmable receiver circuit is coupled to a common node at the source of the transistor 226 and the drain of the transistor 228. The hysteresis circuit comprises a transistor 232 coupled to a node at the source of the transistor 226 and the drain of the transistor 228. An enable transistor 234 is coupled in series with the transistor 232, and receives the second inverted control signal (en_1 v5_b) at its gate. The pull-up branch 236 of the second programmable receiver comprises a first transistor 238 and a second transistor 240 coupled in series between the reference voltage Vcco and the output node 209, where the node at the drain of transistor 238 and the source of transistor 240 is coupled to transistor 234 of the hysteresis circuit associated with the second programmable receiver circuit.

An output stage 211 coupled to the output node 209 comprises a first inverter having a pair of transistors 242 and 244 coupled in series between a reference voltage Vccint_io (which is generally a lower voltage that Vcco) and ground, where the drains of the transistors 242 and 244 are coupled to output inverters 246 and 248 which may also be provided to generate an output signal at an output 249. Receiver enable circuits which enable the operation of the receiver may also be provided. For example, a transistor 250 coupled between the output node 209 and ground enables pulling the output node 209 to ground in response to a power-on request signal (por_Vccaux) coupled to its gate. The output may also be disabled in response to an inverted enable signal (enable_b) coupled to the gate of transistor 252.

FIG. 2 can be viewed as a combination of two pull-up branches and two pull-down branches. By having the hysteresis devices in the pull-up branch as opposed to pull-down branch, it is possible to achieve improved margins. As is apparent, two enable signals enable selecting one of two receiver circuits which may receive the input signal according to a corresponding receiver standard. The circuit of FIG. 2 may be implemented with 1.2 volt and 1.5 volt input signals to implement the LVCMOS12 and LVCMOS15 standards, for example, where one of the standards is implemented for a selected receiver of the programmable receiver.

Figures 3, 4:
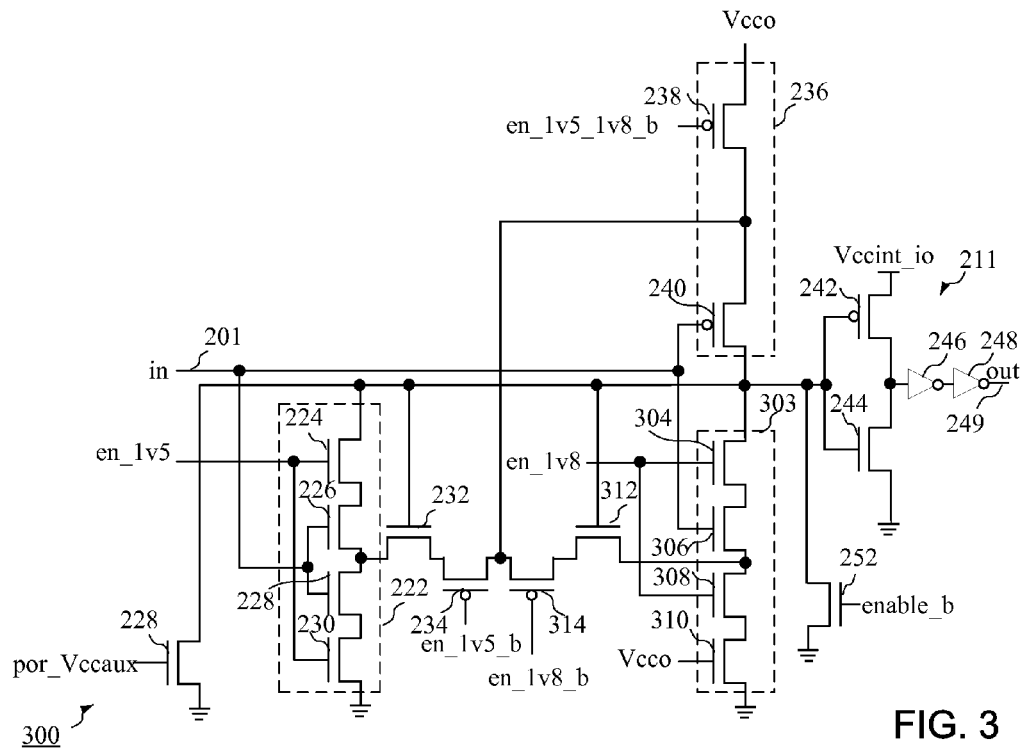
FIG. 3 is a block diagram of a programmable receiver adapted to receive data having one of two different input voltages at an input/output port.
FIG. 4 is another block diagram of a programmable receiver adapted to receive data having one of two different input voltages at an input/output port.

Turning now to FIG. 3, another block diagram of a programmable receiver 300 adapted to receive data having one of two input voltages at input/output ports is shown. According to the arrangement of FIG. 3, rather than configuring the circuit to implement the LVCMOS12 and LVCMOS15 standards, the arrangement of FIG. 3 implements LVCMOS15 and LVCMOS18 standards. That is, rather than implementing the programmable receiver circuit having the pull-up branch 202 and the pull down branch 210 enabling implementing a LVCMOS12 receiver, additional circuits are provided to implement an LVCMOS 18 circuit with the LVCMOS15 circuit (i.e. pull-down branch 222 and pull-up branch 236) of FIG. 2. While the same pull-up branch 236 is used for a programmable receiver circuit implementing the LVCMOS15 and LVCMOS18 standards, an additional pull-down branch and hysteresis circuit is provided to enable implementing the LVCMOS18 standard. In particular, a pull-down branch 303 comprises a series of transistors 304-310 coupled between the output node 209 and ground. The gates of transistors 304 and 308 are coupled to receive an enable signal (en_1 v8), and the gate of the transistor 306 is coupled to receive the input signal. Further, a hysteresis circuit comprising transistors 312 and 314 is coupled to a node coupling the source of transistor 306 and the drain of transistor 308. As shown in FIG. 3, the hysteresis circuits are coupled to corresponding pull down circuits for receiving one of two higher voltage signals, such as 1.5 volt or 1.8 volt signals. That is, either transistor 232 of the hysteresis circuit associated with the pull-down branch 222 (of the first receiver circuit) or transistor 312 of the pull-down branch 303 (of the second receiver circuit) is coupled to the node between the drain of transistor 238 and the source of the transistor 240 of the pull-up branch 236 used by both the first receiver circuit and the second receiver circuit.

Turning now to FIG. 4, another block diagram of a programmable receiver adapted to receive data having one of two input voltages at input/output ports is shown. The circuit arrangement of FIG. 4 enables receiving either a low voltage input signal or a high voltage input signal, such as a low voltage input signal having 1.2 volts for the LVCMOS12 standard, or a high voltage input signal having 1.8 volts for the LVCMOS18 standard for example. Accordingly, the pull-up branch 202 (having the associated hysteresis transistors 212 and 214) and the pull-down branch 210 shown in FIG. 2 could be implemented with the pull-up branch 236 and the pull-down branch 303 (having the associated hysteresis transistors 312 and 314), where one of the programmable receivers for one of the standards would be implemented.

Figure 5:
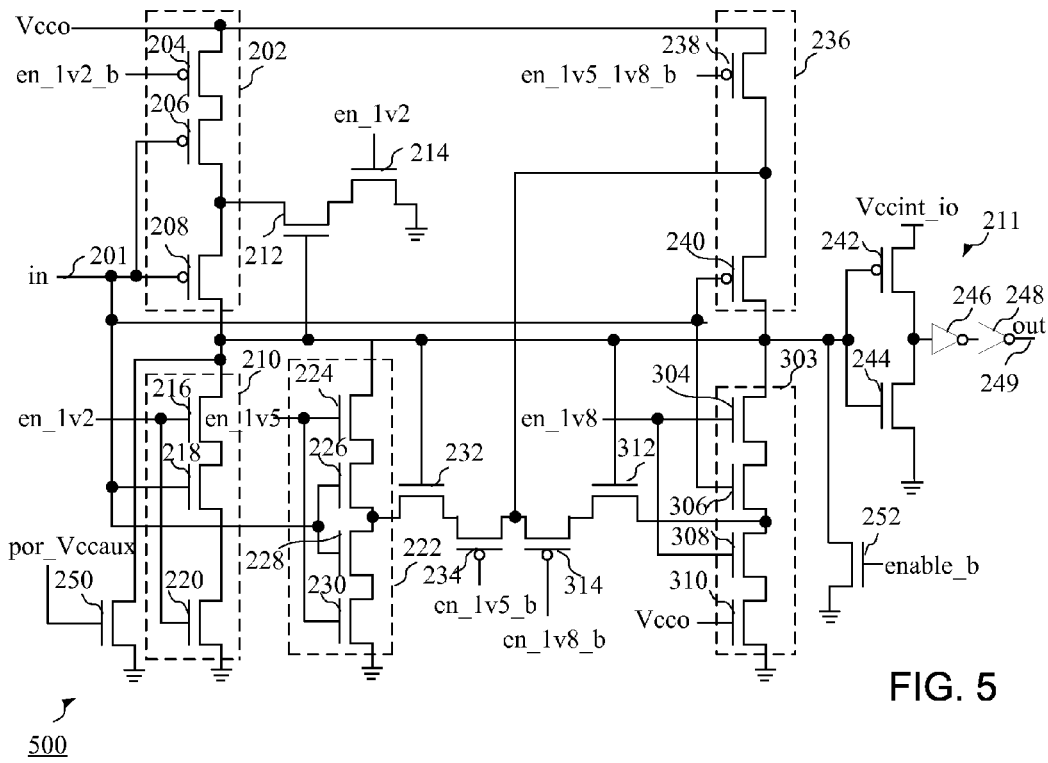
FIG. 5 is a block diagram of a programmable receiver adapted to receive data having one of three input voltages at an input/output port.

Turning now to FIG. 5, a block diagram of a programmable receiver adapted to receive data having one of three input voltages at input/output ports is shown. That is, the pull-up and pull down branches associated with each of the three voltages of FIGS. 2-4 could be implemented in a single circuit, where one of the enable signals for the LVCMOS12, LVCMOS15 and LVCMOS18 standards could be selected to enable a pull-up and a pull-down branch and a corresponding hysteresis circuit for that standard.

Table1 shows the appropriate control signals for each of the standards which may be applied to the various inputs of the circuit of FIGS. 2-5.

TABLE 1

|  | en_1v2 | en_1v2_b | en_1v5 | en_1v5_b | en_1v8 | en_1v8_b2 | en_v1v5_1v8_b |
|---|---|---|---|---|---|---|---|
| LVCMOS12 | 1 | 0 | 0 | 1 | 0 | 1 | 1 |
| LVCMOS15 | 0 | 1 | 1 | 0 | 0 | 1 | 0 |
| LVCMOS18 | 0 | 1 | 0 | 1 | 1 | 0 | 0 |

The control signals may be controlled by the memory cells which configure the I/O, for example. Additional details related to configuring an integrated circuit having programmable resources may be found at least in FIGS. 6-8.

Because each of the LVCMOS12, LVCMOS15 and LVCMOS18 standards is designed for a specific input signal value, either implementing a single circuit for each of the standards or providing specific circuits for particular input/output ports is not practical. With varying Vcco supply for the same circuit, conventional designs managed to have reduced margins for receiving data. LVCMOS12 had less margin to Vih, which is because of less voltage head room for PMOS devices. A need to size the circuit such that LVCMOS12 is within specification resulted in less margin on Vil for LVCMOS18. Implementing the programmability feature by having a combination of pull-up and pull-down legs for each I/O standard provides improved performance for a selected standard by improving the margins for Vil and Vih for all the three I/O standards. The programmable receivers of FIGS. 2-5 may be implemented in controls such as any of the I/O ports of FIG. 1, or any other circuit of an integrated circuit.

Figure 6:
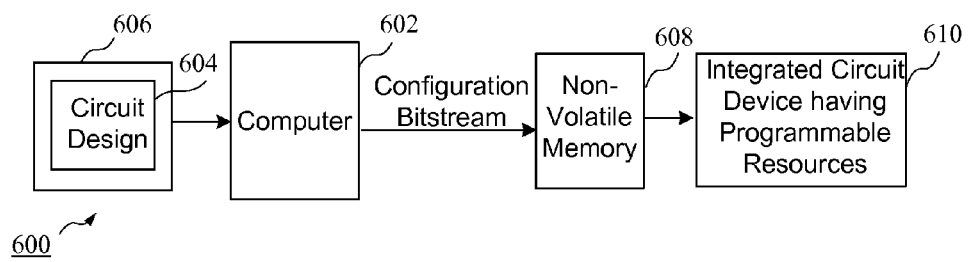
FIG. 6 is a block diagram of a system for programming a device having programmable resources.

Turning now to FIG. 6, a block diagram of a system for programming a device having programmable resources according to an embodiment is shown. In particular, a computer 602 is coupled to receive a circuit design 604 from a memory 606, and generate a configuration bitstream which is stored in the non-volatile memory 608. As will be described in more detail below, the circuit design may be a high level design, such as a circuit design defined in a hardware description language (HDL). Also, the computer may be configured to run software that generates a configuration bitstream which is stored in the non-volatile memory 608 and provided to an integrated circuit 610 which may be a programmable integrated circuit, such as the integrated circuit described below in FIGS. 7 and 8.

Figure 7:
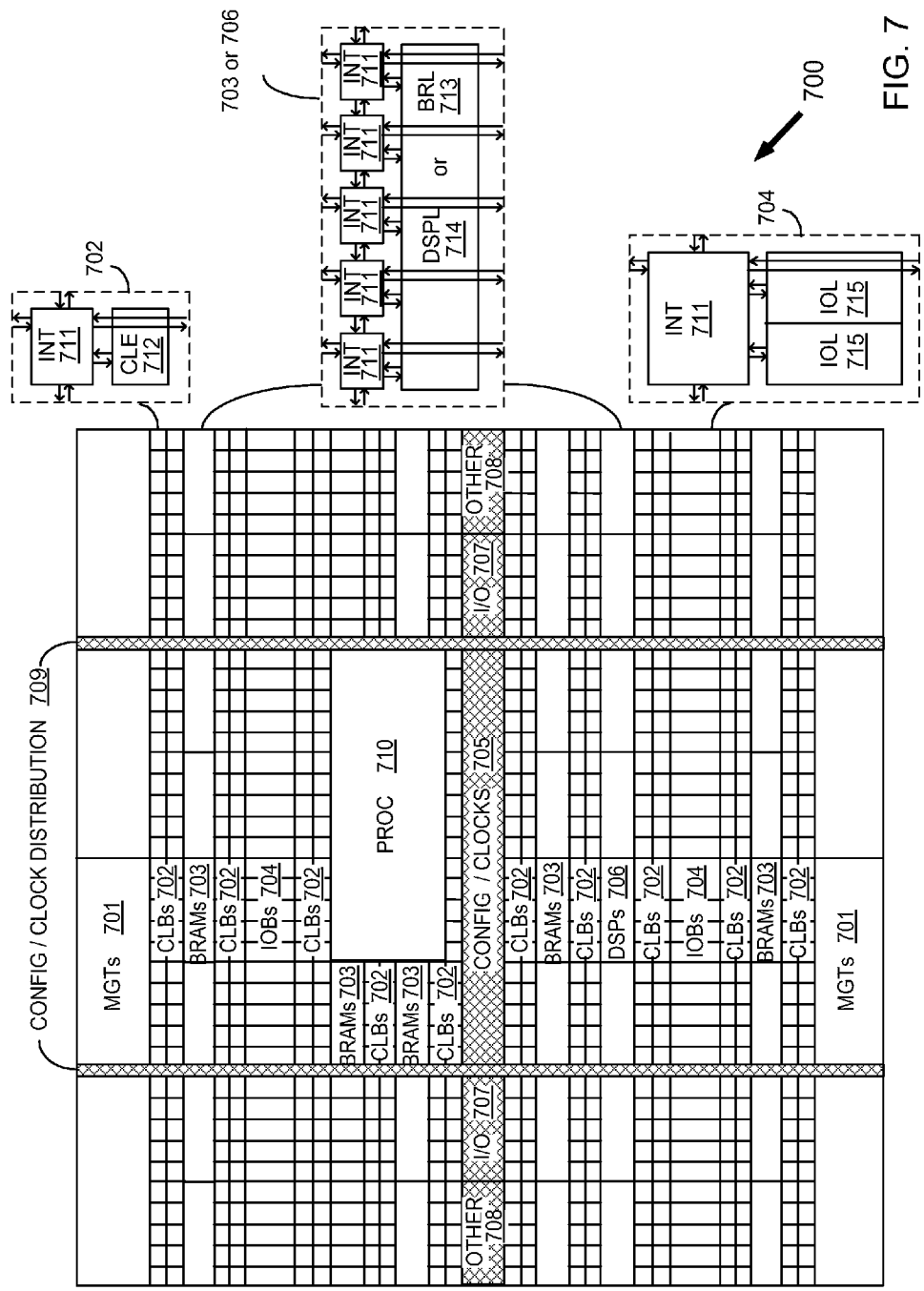
FIG. 7 is a block diagram of a device having programmable resources which may implement the circuits of FIGS. 1-5.

Turning now to FIG. 7, a block diagram of a device having programmable resources including the circuits as implemented in FIGS. 1-5 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 7 comprises an FPGA architecture 700 having a large number of different programmable tiles including multi-gigabit transceivers (MGTs) 701, CLBs 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707 (e.g., configuration ports and clock ports), and other programmable logic 708 such as digital clock managers, analog-to-digital converters, system monitoring logic, and so forth. Some FPGAs also include dedicated processor blocks (PROC) 710, which may be used to implement a software application, for example.

In some FPGAs, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA. The programmable interconnect element 711 also includes the connections to and from the programmable logic element within the same tile, as shown by the examples included at the top of FIG. 7.

For example, a CLB 702 may include a configurable logic element (CLE) 712 that may be programmed to implement user logic plus a single programmable interconnect element 711. A BRAM 703 may include a BRAM logic element (BRL) 713 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 706 may include a DSP logic element (DSPL) 714 in addition to an appropriate number of programmable interconnect elements. An 10B 704 may include, for example, two instances of an input/output logic element (IOL) 715 in addition to one instance of the programmable interconnect element 711. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 709 extending from this column are used to distribute the clocks and configuration signals across the breadth of the FPGA. Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear in order to facilitate the efficient implementation of user logic. While the embodiment of FIG. 7 relates to an integrated circuit having programmable resources, it should be understood that the circuits and methods set forth in more detail below could be implemented in any type of ASIC.

Figure 8:
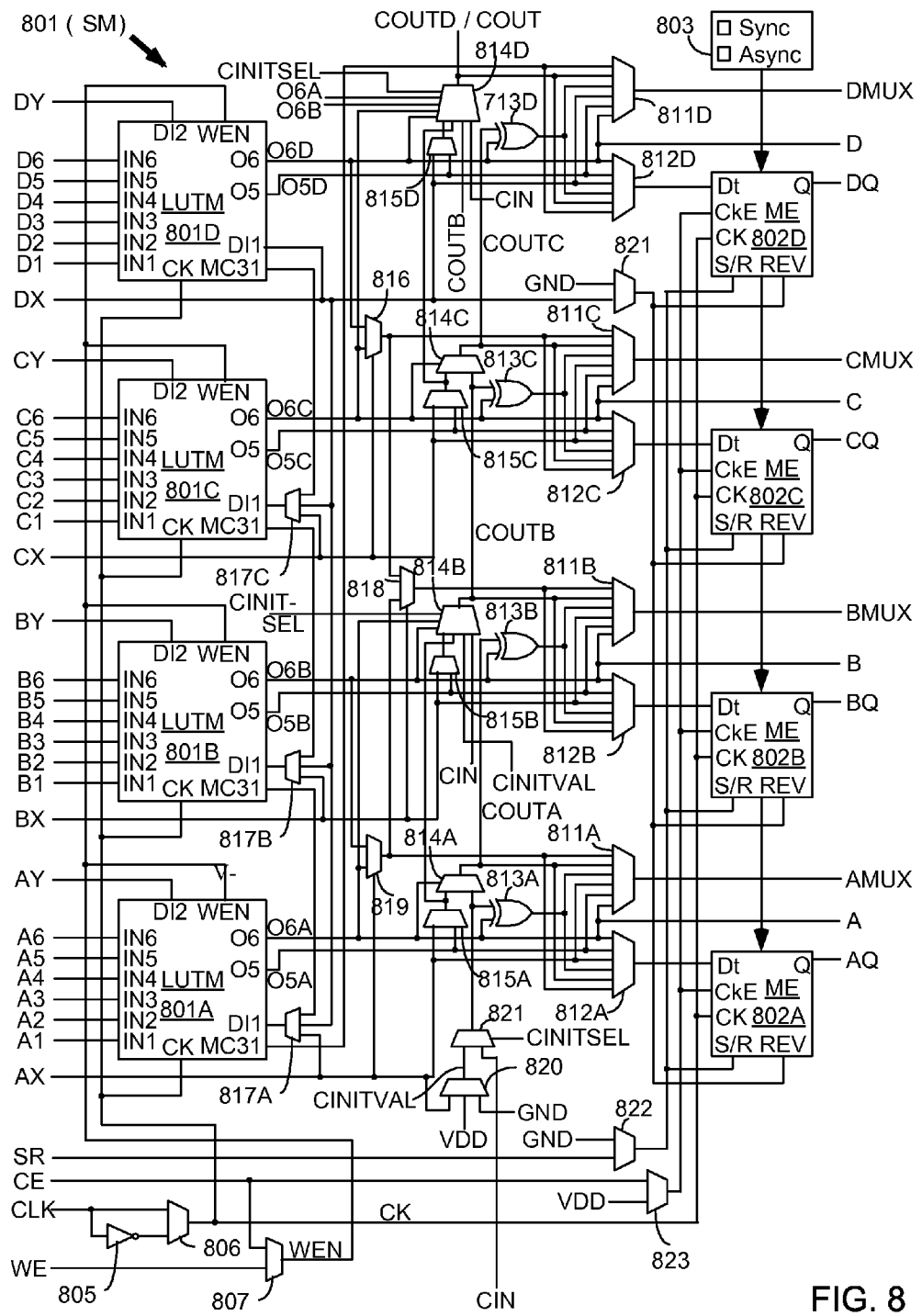
FIG. 8 is a block diagram of a configurable logic element of the device of FIG. 7.

Turning now to FIG. 8, block diagram of a configurable logic element of the device of FIG. 7 is shown. In particular, FIG. 8 illustrates in simplified form a configurable logic element of a configuration logic block 702 of FIG. 7. In the embodiment of FIG. 8, slice M 801 includes four lookup tables (LUTMs) 801A-801D, each driven by six LUT data input terminals A1-A6, B1-B6, C1-C6, and D1-D6 and each providing two LUT output signals O5 and O6. The O6 output terminals from LUTs 801A-801D drive slice output terminals A-D, respectively. The LUT data input signals are supplied by the FPGA interconnect structure via input multiplexers, which may be implemented by programmable interconnect element 811, and the LUT output signals are also supplied to the interconnect structure. Slice M also includes: output select multiplexers 811A-811D driving output terminals AMUX-DMUX; multiplexers 812A-812D driving the data input terminals of memory elements 802A-802D; combinational multiplexers 816, 818, and 819; bounce multiplexer circuits 822-823; a circuit represented by inverter 805 and multiplexer 806 (which together provide an optional inversion on the input clock path); and carry logic having multiplexers 814A-814D, 815A-815D, 820-821 and exclusive OR gates 813A-813D. All of these elements are coupled together as shown in FIG. 8. Where select inputs are not shown for the multiplexers illustrated in FIG. 8, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 8 for clarity, as well as from other selected figures herein.

In the pictured embodiment, each memory element 802A-802D may be programmed to function as a synchronous or asynchronous flip-flop or latch. The selection between synchronous and asynchronous functionality is made for all four memory elements in a slice by programming Sync/Asynch selection circuit 803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 802A-802D are clocked by a clock signal CK, which may be provided by a global clock network or by the interconnect structure, for example. Such programmable memory elements are well known in the art of FPGA design. Each memory element 802A-802D provides a registered output signal AQ-DQ to the interconnect structure. Because each LUT 801A-801D provides two output signals, O5 and O6, the LUT may be configured to function as two 5-input LUTs with five shared input signals (IN1-IN5), or as one 6-input LUT having input signals IN1-IN6.

In the embodiment of FIG. 8, each LUTM 801A-801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 817A-817C for LUTs 801A-801C), or to the two 32-bit RAMs via input terminals DI1 and DI2. RAM write operations in the LUT RAMs are controlled by clock signal CK from multiplexer 806 and by write enable signal WEN from multiplexer 807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 801A may also be provided to the general interconnect structure for shift register chaining, via output select multiplexer 811D and CLE output terminal DMUX. Accordingly, the circuits and methods set forth above may be implemented in a device such as the devices of FIGS. 7 and 8, or any other suitable device.

Figure 9:
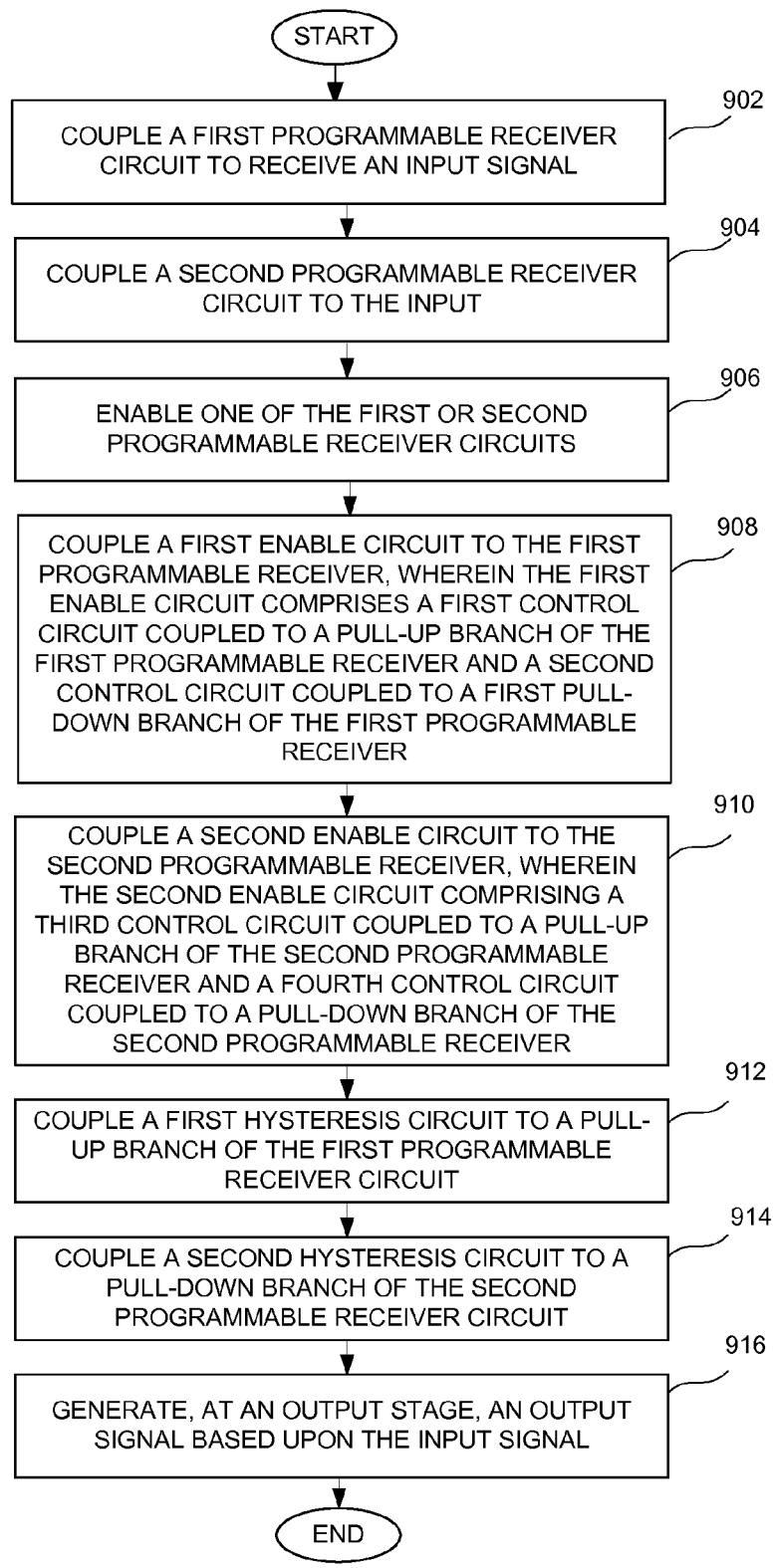
FIG. 9 is a flow chart showing a method of implementing a programmable receiver in an integrated circuit device.

Turning now to FIG. 9, a flow chart shows a method of implementing a programmable receiver in an integrated circuit. In particular, a first programmable receiver circuit is coupled to receive an input signal at a step 902. A second programmable receiver circuit is coupled to the input at a step 904. One of the first or second programmable receiver circuits is enabled at a step 906. A first enable circuit is coupled to the first programmable receiver, wherein the first enable circuit comprises a first control circuit coupled to a pull-up branch of the first programmable receiver and a second control circuit coupled to a first pull-down branch of the first programmable receiver at a step 908. A second enable circuit is coupled to the second programmable receiver, wherein the second enable circuit comprising a third control circuit coupled to a pull-up branch of the second programmable receiver and a fourth control circuit coupled to a pull-down branch of the second programmable receiver at a step 910. A first hysteresis circuit is coupled to a pull-up branch of the first programmable receiver circuit at a step 912. A second hysteresis circuit is coupled to a pull-down branch of the second programmable receiver circuit at a step 914. An output signal is generated at an output stage based upon the input signal at a step 916.

While specific elements of the method are described, it should be understood that additional elements of the method, or additional details related to the elements 902-916, could be implemented according to the disclosure of FIGS. 1-8.

It can therefore be appreciated that a programmable receiver and methods of implementing a programmable receiver in an integrated circuit device have been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A programmable receiver of an integrated circuit, the programmable receiver comprising:
    an input;
    a first programmable receiver circuit coupled to the input, wherein the first programmable receiver circuit has a first pull-up branch and a first pull-down branch and is controlled by a first enable circuit;
    a second programmable receiver circuit coupled to the input, wherein the second programmable receiver circuit has a second pull-up branch and a second pull-down branch and is controlled by a second enable circuit; and
    an output stage coupled to the first programmable receiver circuit and the second programmable receiver circuit, wherein the output stage receives an output of one of the first programmable receiver circuit and the second programmable receiver circuit.

2. The programmable receiver of claim 1 wherein the first programmable receiver circuit comprises a receiver for receiving a signal having a first voltage and the second programmable receiver circuit comprises a receiver for receiving a signal having a second voltage which is greater than the first voltage.

3. The programmable receiver of claim 2 further comprising a first hysteresis circuit coupled to the first pull-up branch.

4. The programmable receiver of claim 3 further comprising a second hysteresis circuit coupled to the second pull-down branch.

5. The programmable receiver of claim 1 wherein the first enable circuit comprises a first control circuit coupled to the first pull-up branch and a second control circuit coupled to the first pull-down branch.

6. The programmable receiver of claim 5 wherein the second enable circuit comprises a third control circuit coupled to the second pull-up branch and a fourth control circuit coupled to the second pull-down branch.

7. The programmable receiver of claim 1 further comprising a third programmable receiver circuit coupled to the input, the third programmable receiver circuit having a third pull-down branch, wherein the third pull-down branch is controlled by a fifth enable circuit.

8. A programmable receiver of an integrated circuit, the programmable receiver comprising:
    an input;
    a first programmable receiver circuit coupled to the input, the first programmable receiver circuit having a first pull-up branch and a first pull-down branch;
    a first hysteresis circuit coupled to the first-pull up branch;
    a second programmable receiver circuit coupled to the input, the second programmable receiver circuit having a second pull-up branch and a second pull-down branch;
    a second hysteresis circuit coupled to the second pull-down branch; and
    an output stage coupled to the first programmable receiver circuit and the second programmable receiver circuit, wherein the output stage receives an output of one of the first programmable receiver circuit and the second programmable receiver circuit.

9. The programmable receiver of claim 8 wherein the first programmable receiver circuit comprises a receiver for receiving a signal having a first voltage and the second programmable receiver circuit comprises a receiver for receiving a signal having a second voltage which is greater than the first voltage.

10. The programmable receiver of claim 9 further comprising a first enable circuit coupled to the first pull-up branch.

11. The programmable receiver of claim 10 further comprising a second enable circuit coupled to the first pull-down branch.

12. The programmable receiver of claim 11 wherein the first enable circuit comprises a first control circuit coupled to the first pull-up branch and a second control circuit coupled to the first pull-down branch.

13. The programmable receiver of claim 12 wherein the second enable circuit comprises a third control circuit coupled to the second pull-up branch and a fourth control circuit coupled to the second pull-down branch.

14. The programmable receiver of claim 8 further comprising a third programmable receiver circuit coupled to the input, the third programmable receiver circuit having a third pull-down branch, wherein the third pull-down branch comprises a fifth enable circuit.

15. A method of implementing a programmable receiver in an integrated circuit, the method comprising:
coupling a first programmable receiver circuit to an input;
coupling a second programmable receiver circuit to the input;
enabling one of the first and second programmable receiver circuits;
generating, at an output stage, an output signal based upon the input signal; and
coupling a first enable circuit to the first programmable receiver, wherein the first enable circuit comprises a first control circuit coupled to a pull-up branch of the first programmable receiver and a second control circuit coupled to a first pull-down branch of the first programmable receiver.

16. The method of claim 15 further comprising coupling a first hysteresis circuit to a pull-up branch of the first programmable receiver circuit.

17. The method of claim 16 further comprising coupling a second hysteresis circuit to a pull-down branch of the second programmable receiver circuit.

18. The method of claim 15 further comprising coupling a second enable circuit to the second programmable receiver, wherein the second enable circuit comprises a third control circuit coupled to a pull-up branch of the second programmable receiver and a fourth control circuit coupled to a pull-down branch of the second programmable receiver.

19. The method of claim 15 further comprising coupling a third programmable receiver circuit to the input, the third programmable receiver circuit having a third pull-down branch, wherein the third pull-down branch comprises a fifth enable circuit.

* * * * *